United States Patent
Park

(10) Patent No.: US 8,339,825 B2
(45) Date of Patent: Dec. 25, 2012

(54) NONVOLATILE MEMORY DEVICE AND OPERATION METHOD THEREOF

(75) Inventor: Jin Su Park, Daegu (KR)

(73) Assignee: Hynix Seminconductor Inc., Icheon-si, Gyeounggi-do (KR)

( * ) Notice: Subject to any disclaimer, the term of this patent is extended or adjusted under 35 U.S.C. 154(b) by 217 days.

(21) Appl. No.: 12/826,162

(22) Filed: Jun. 29, 2010

(65) Prior Publication Data

US 2010/0328979 A1 Dec. 30, 2010

(30) Foreign Application Priority Data

Jun. 30, 2009 (KR) .................. 10-2009-0059154

(51) Int. Cl.
*G11C 15/00* (2006.01)
*G11C 11/34* (2006.01)
(52) U.S. Cl. ............. 365/49.1; 365/185.09; 365/185.11; 365/185.12; 365/185.17; 365/185.18; 365/185.29
(58) Field of Classification Search .................. 365/49.1, 365/49.11, 49.12, 49.16, 185.09, 185.11, 365/185.17, 185.18, 185.29, 185.33, 185.12
See application file for complete search history.

(56) References Cited

U.S. PATENT DOCUMENTS

| | | | | |
|---|---|---|---|---|
| 5,088,066 A * | 2/1992 | Castro | ...................... | 365/185.09 |
| 5,136,544 A * | 8/1992 | Rozman et al. | ............... | 365/49.1 |
| 5,377,147 A * | 12/1994 | Merchant et al. | ........ | 365/185.09 |
| 6,166,938 A * | 12/2000 | Wong | .......................... | 365/49.1 |
| 6,256,216 B1 * | 7/2001 | Lien et al. | ..................... | 365/49.1 |
| 6,381,163 B1 * | 4/2002 | Kurihara et al. | ........... | 365/49.12 |
| 7,151,682 B2 * | 12/2006 | Haid et al. | ............... | 365/185.18 |
| 7,307,894 B2 * | 12/2007 | Kido et al. | ............... | 365/185.11 |
| 7,328,301 B2 * | 2/2008 | Eilert et al. | .............. | 365/185.17 |
| 7,336,516 B2 * | 2/2008 | Tran et al. | .................... | 365/49.1 |
| 8,023,341 B2 * | 9/2011 | Kawabata et al. | ........... | 365/49.1 |

FOREIGN PATENT DOCUMENTS

KR 1020100013187 2/2010

OTHER PUBLICATIONS

Korean Office Action for application No. 10-2009-0059154.

* cited by examiner

*Primary Examiner* — Trong Phan
(74) *Attorney, Agent, or Firm* — Lowe Hauptman Ham & Berner, LLP

(57) ABSTRACT

In a method of operating a nonvolatile memory device, at least one among memory cell blocks of the nonvolatile memory device is designated as a content addressable memory (CAM) block which includes a plurality of CAM cells coupled to respective word lines of the nonvolatile memory device. Chip information for operations of the nonvolatile memory device is stored in the CAM cells which are coupled to a selected word line, whereas the remaining CAM cells of the CAM block are in an erased state.

6 Claims, 2 Drawing Sheets

NONVOLATILE MEMORY DEVICE AND OPERATION METHOD THEREOF

CROSS-REFERENCE TO RELATED APPLICATIONS

The present application claims priority under 35 U.S.C 119(a) to Korean Application No. 10-2009-0059154, filed on Jun. 30, 2009, in the Korean Intellectual Property Office, which is incorporated by reference in its entirety as set forth in full.

BACKGROUND

1. Technical Field

The disclosure relates generally to nonvolatile memory devices and operation methods thereof, and particularly, to an operation method for a content addressable memory (CAM) block utilized as a read-only memory (ROM) in a nonvolatile memory device.

2. Related Art

For the function as a ROM, nonvolatile memory devices have been known to employ fuses to retain chip information and data relevant to operations therein. As the integration density of nonvolatile memory devices increases dramatically, such fuses have met scaling-down factor and/or manufacturing difficulty limits.

Because of those practical limitations, recent nonvolatile memory devices replace fuses with content addressable memory (CAM) cells, which are formed in a memory cell structure as a section of ROM. These CAM cells are disposed in a CAM block within a memory cell array of a nonvolatile memory device. For instance, a memory cell array of a nonvolatile memory device may be organized to include a memory block for storing normal data and a CAM block for storing chip information.

FIG. 1 shows a block configuration of a nonvolatile memory device.

The nonvolatile memory device of FIG. 1 includes a voltage supply circuit 10, a block switching circuit 20, a memory cell array 30 and a page buffer circuit 40.

The voltage supply circuit 10 transfers high voltages to global lines GDSL, GWL0~GWLn and GSSL.

The block switching circuit 20 selects one from a plurality of memory cell blocks of the memory cell array 30 and transfers the high voltages from the voltage supply circuit 10 to a drain selection line DSL, word lines WL0~WLn and source selection line SSL of the selected memory cell block.

The memory cell array 30 includes the memory cell blocks storing normal data and a CAM block storing chip information. This chip information contains redundancy information and voltage levels used in programming, reading and erasing operations. One of the memory cell blocks belonging to the memory cell array 30 is designated as the CAM block.

The page buffer circuit 40 is coupled to the CAM block and the memory cell blocks by way of bit lines BL, and variably sets voltages of the bit lines in programming, reading and erasing operations.

When a power source voltage is applied to a chip (not shown) of the nonvolatile memory device (i.e., the nonvolatile memory device is powered up), the chip first begins reading the CAM block. Thus, the chip functions in accordance with the read chip information. A plurality of CAM cells included in the CAM block are distributed over different CAM pages (a CAM page means a unit of CAM cells coupled to the same word line). When a world line is selected to read the CAM cells coupled to the selected word line, it is required to apply a pass voltage of a high voltage level (e.g., 5V) to the remaining word lines coupled to the unselected CAM cells during the reading operation. For this reason, the nonvolatile memory device must be equipped with a pumping circuit for supplying such a high voltage, inevitably increasing current consumption due to the use of the high voltage. Moreover, a high voltage (e.g., the pass voltage) applied to gates of the unselected CAM cells during the reading operation may eventually deteriorate electric characteristics, causing the reliability of the nonvolatile memory device to be worsened over time.

SUMMARY

In a method of operating a nonvolatile memory device in accordance with some embodiments, at least one among memory cell blocks of the nonvolatile memory device is designated as a content addressable memory (CAM) block which includes a plurality of CAM cells coupled to respective word lines of the nonvolatile memory device. Chip information for operations of the nonvolatile memory device is stored in the CAM cells which are coupled to a selected word line, whereas the remaining CAM cells of the CAM block are in an erased state.

In some embodiments, a nonvolatile memory device comprises at least a memory cell block, a content addressable memory (CAM) block, and a voltage supply circuit. The memory cell block includes memory cells that are coupled to a plurality of word lines, respectively, and store data. The CAM block includes CAM cells that are coupled to the word lines, respectively, and store chip information for operations of the nonvolatile memory device. The voltage supply circuit supplies a first read voltage to a selected word line while supplying a first pass voltage to unselected word lines in reading the memory cell block. The voltage supply circuit also supplies a second read voltage to a selected word line while supplying a second pass voltage to unselected word lines in reading the CAM block. The second pass voltage is lower than the first pass voltage.

DETAILED DESCRIPTION OF EMBODIMENTS

Hereinafter, various exemplary embodiments will now be described more fully with reference to the accompanying drawings in which some exemplary embodiments are shown. However, specific structural and functional details disclosed herein are merely representative for purposes of describing exemplary embodiments of the present invention.

The terminology used herein is for the purpose of describing particular embodiments only and is not intended to limit the scope of the disclosure. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Further, it will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the disclosure. As used herein, the term "and/or" includes any and all combinations of one or more of the associated listed items. Also will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In order to more specifically describe exemplary embodiments, various aspects will be hereinafter described in detail with reference to the attached drawings.

Figure 2:
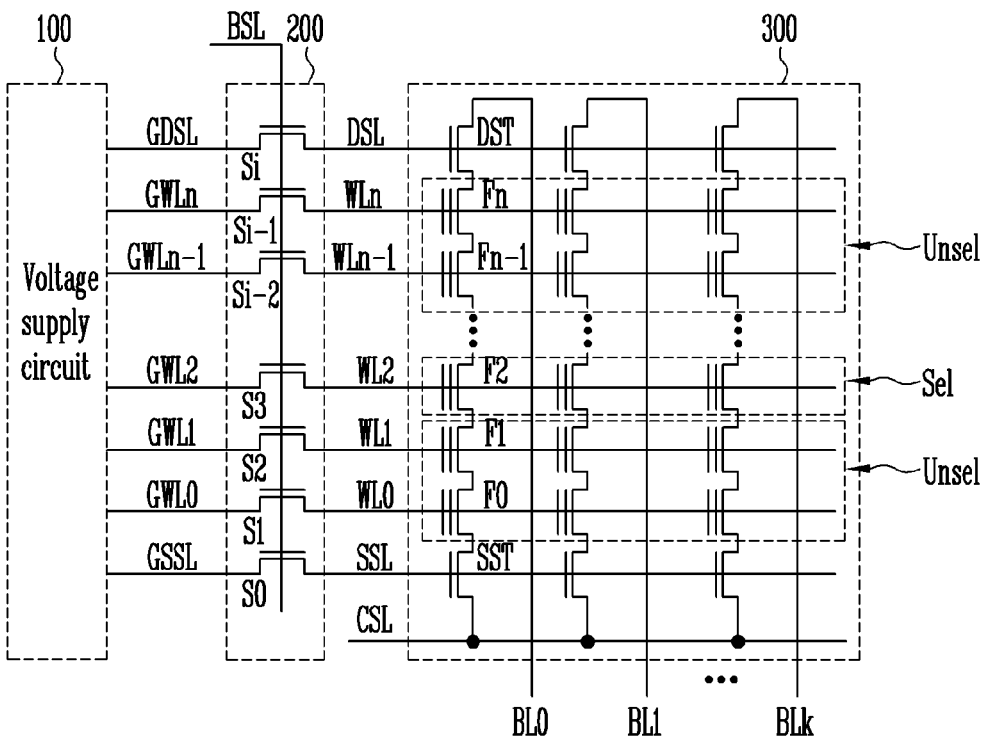
FIG. 2 is a circuit diagram illustrating an operating feature of a nonvolatile memory device according to one or more embodiments of the present invention.

FIG. 2 illustrates an operating feature of a nonvolatile memory device according to one or more embodiments of the present invention.

Referring to FIG. 2, the nonvolatile memory device includes a voltage supply circuit 100, a block switching circuit 200 and a content addressable memory (CAM) block 300.

Figure 1:
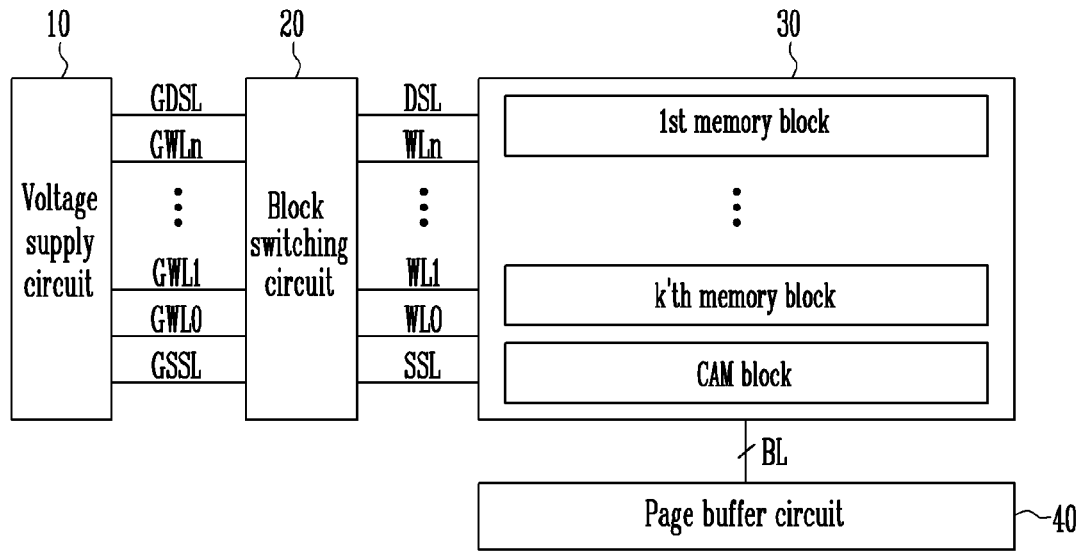
FIG. 1 is a block diagram illustrating a nonvolatile memory device.

The nonvolatile memory device in some embodiments further includes a memory cell array (not shown in FIG. 2) composed of a plurality of memory cell blocks (not shown in FIG. 2). An exemplary configuration of such a memory cell array and the respective memory cell blocks has been given above with respect to the description of FIG. 1.

The voltage supply circuit 100 transfers operating voltages, e.g., high voltages, to a global drain selection line GDSL, global word lines GWL0~GWLn and a global source selection line GSSL.

The block switching circuit 200 selects one from the memory cell blocks of the memory cell array. The block switching block 200 includes switching elements S0~Si coupled respectively between the global source selection line GSSL and a source selection line SSL, between the global word lines GWL0~GWLn and word lines WL0~WLn, and between the global drain selection line GDSL and a drain selection line DSL. The switching elements S0~Si are operated together in response to a block selecting signal BSL. In some embodiments, the word lines WL0~WLn are respectively connected to the memory cell blocks of the memory cell array.

The CAM block 300 includes a plurality of CAM cells F0~Fn in which chip information (i.e., information for controlling a chip (not shown) supporting operation of the nonvolatile memory device) is stored. In some embodiments, one or more memory cell blocks of the memory cell array is/are designated as the CAM block 300. In some embodiments, CAM cells belonging to the CAM block 300 are formed in the same structure as memory cells of the other memory cell blocks of the memory cell array. Storing the chip information, the CAM block 300 is first read when a power source voltage is supplied into the chip (i.e., the nonvolatile memory device is powered up).

The CAM block 300 includes a plurality of strings. Each string is formed of a drain selection transistor DST, CAM cells F0~Fn and a source selection transistor SST which are electrically connected in series to a bit line. An exemplary string is depicted in detail in FIG. 2 as being connected to bit line BL0. Specifically, the drain selection transistor DST is coupled between the n+1$^{th}$ CAM cell Fn and a first bit line BL0. The source selection transistor SST is coupled between the first CAM cell F0 and a common source line CSL. Here, a CAM page is defined as a group of CAM cells, which are coupled to the same word line and which belong to different strings. An exemplary CAM page is depicted by a dot-dot block labeled as "Sel" in FIG. 2. Each dot-dot block labeled "Unsel" in FIG. 2 designates two CAM pages associated with the word lines WLn, WLn−1 and the word lines WL0, WL1, respectively.

The CAM cells F0~Fn included in the CAM block 300 store redundancy information and/or the chip information containing information necessary for programming, reading and erasing operations of the memory cell array. The description below will be given for the chip information stored in the CAM page of CAM cells F2 that are coupled to the second word line WL2. Other arrangements are within the scope of this disclosure.

If the CAM cells F2 coupled to the selected ("Sel") second word line WL2 are programmed to store the chip information, other CAM cells coupled to unselected word lines Unsel are held on an erased state.

As the unselected CAM cells F0~F1 and F3~Fn are conditioned in the erased state, it is permissible to apply a read voltage to the selected word line WL2 while a pass voltage of a low voltage level is supplied to the word lines WL0, WL1 and WL3~WLn other than the selected word line WL2. In some embodiments, the read voltage is set on 0V and the pass voltage is leveled to or lower than the power supply voltage. Thus, the nonvolatile memory device does not require a pumping circuit for elevating the pass voltage to a high level (e.g., 5V~7V) during the reading of the CAM block 300. Besides, since the CAM cells are lessened in stress as a lower pass voltage is applied to the unselected word lines instead of a high pass voltage, a potential deterioration of the electrical characteristics of the CAM cells can be slowed down.

When the power source voltage is supplied into the chip (i.e., the chip is powered up), it begins to read the CAM cells that are included in the CAM block 300. First, the power source voltage (e.g., Vcc, best seen in FIG. 3) is applied to all of bit lines BL0~BLk coupled to the CAM block 300 and then the bit lines BL0~BLk are precharged. The voltage supply circuit 100 generates and supplies drive voltages respectively to the global drain selection line GDSL, the global word lines GWL0~GWLn and the global source selection line GSSL. The read voltage is applied to a selected one of the global word lines, e.g., GWL2, and the pass voltage is applied to the remaining, unselected global word lines, e.g., GWL0, GWL1 and GWL3~GWLn. The pass voltage is equal to or lower than the power source voltage. The reason for such a low pass voltage is that there is no need for a high pass voltage because the CAM cells coupled to the unselected word lines have been already erased. That is, channels are formed in the CAM cells coupled to the unselected word lines even if a low pass voltage is applied to the unselected word lines.

Therefore, the selected CAM cells can be successfully read by applying the read voltage to the selected second word line WL2 while applying the low pass voltage to the remaining unselected word lines WL0, WL1 and WL3~WLn.

Through the aforementioned manner, the drive voltages (the read voltage and the pass voltage) are transferred from the voltage supply circuit 100 to the word lines WL0~WLn. An exemplary way of adjusting the drive voltage to the selected word line Sel and the unselected word lines Unsel will be explained herein with respect to FIG. 3.

Figure 3:
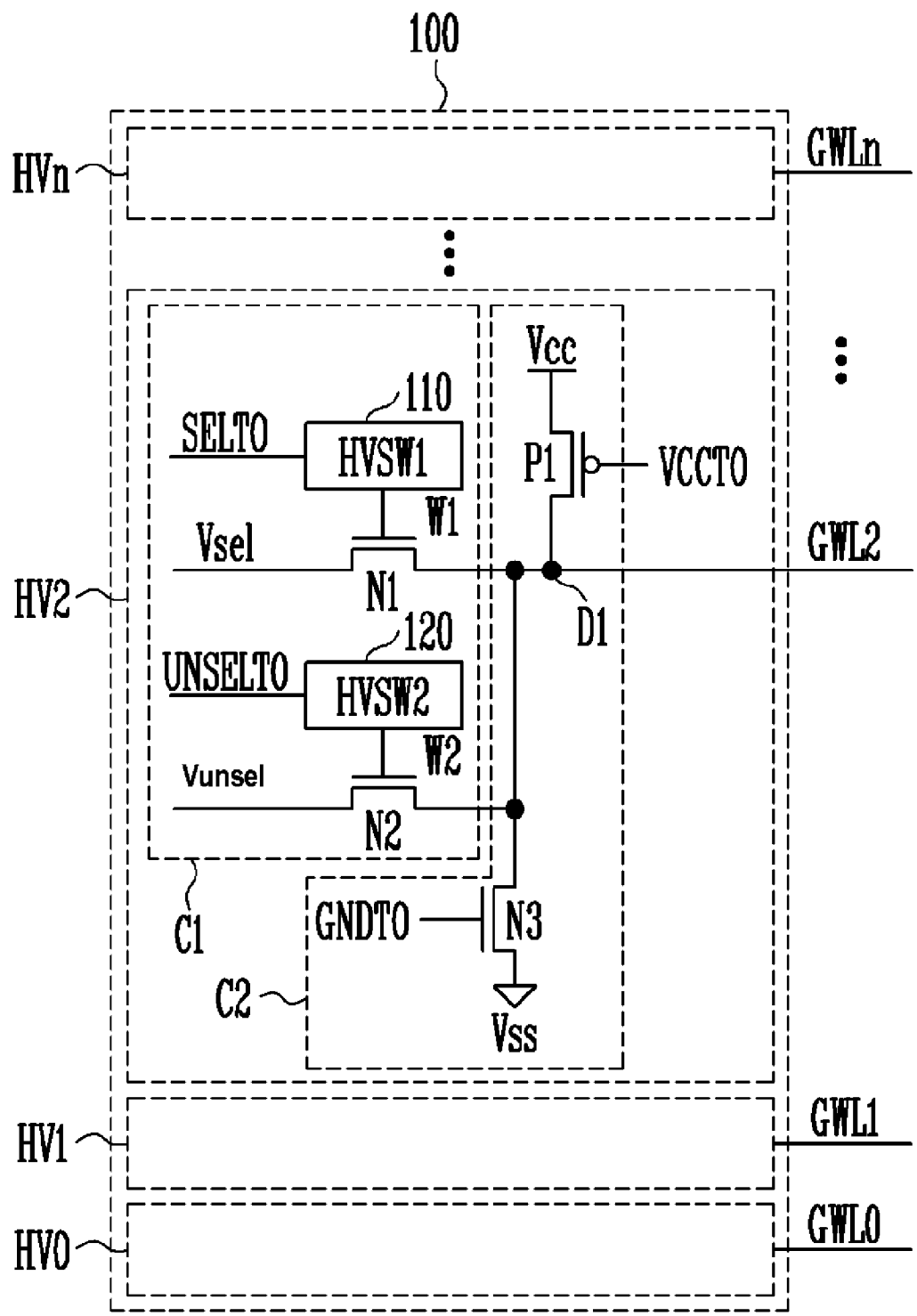
FIG. 3 is a circuit diagram illustrating a voltage supply circuit of the nonvolatile memory device according to one or more embodiments of the present invention.

FIG. 3 shows an embodiment of the voltage supply circuit 100, and a voltage supply operation of the nonvolatile memory device according to one or more embodiments of the present invention will be described with reference to FIG. 3.

The voltage supply circuit 100 outputs the read voltage and the pass voltage while reading the memory cell blocks of the memory cell array or the CAM block 300.

As illustrated in FIG. 3, to independently supply the read voltages or the pass voltages in the reading operation of the CAM block 300, the voltage supply circuit 100 is comprised of a plurality of voltage output circuits HV0~HVn. Then, the voltage output circuits HV0~HVn generate various drive voltages, e.g., a first read voltage, a first pass voltage, a second read voltage, a second pass voltage, etc., to the global word lines GWL0~GWLn.

The voltage output circuits HV0~HVn are formed in the same structure, so only one of them (e.g., HV2) will be described in detail.

Now referring to FIG. 3, the voltage output circuit HV2 includes a first circuit C1 that generates the first read voltage or the first pass voltage to the global word line GWL2 while reading a memory cell block other than the CAM block 300, and a second circuit C2 that generates the second read voltage or the second pass voltage to the global word line GWL2 while reading the CAM block 300.

The first circuit C1 includes a first switch N1 (e.g., an NMOS switch) that transfers the first read voltage Vsel to the global word line GWL2 via a node D1 in accordance with a first signal W1, and a second switch N2 (e.g., an NMOS switch) that transfers the first pass voltage Vunsel to the global word line GWL2 via the node D1 in accordance with a second signal W2. The first signal W1 is generated from a first switching circuit 110 (HVSW1) in response to a selection signal SELT0. The second signal W2 is generated from a second switching circuit 120 (HVSW2) in response to an unselection signal UNSELT0. Other arrangements, e.g., where one or both of the switches N1, N2 is/are PMOS or of any other types of switch, are within the scope of this disclosure.

The second circuit C2 includes a third switch N3 (e.g., an NMOS switch) that electrically connects the global word line GWL2 with a ground terminal Vss in response to a ground signal GNDT0, and a fourth switch P1 (e.g., a PMOS switch) that electrically connects the global word line GWL2 with the power source terminal Vcc in response to a signal VCCT0. Other arrangements, e.g., where one or both of the switches N3, P1 is/are of any other types of switch, are within the scope of this disclosure.

When a memory cell block other than the CAM block 300 and associated with the respective word line (e.g., GWL2 in FIG. 3 and WL2 in FIG. 2) is selected to be read, the first read voltage is variably leveled dependent on a memory cell to be read from the selected memory cell block. When the memory cell block is not selected, the first pass voltage is outputted by the respective voltage output circuit (e.g., HV2) at a high level (5V~7V) for reading a memory cell block.

When a CAM page (e.g., Sel in FIG. 2) of the CAM block 300 is selected to be read, the second read voltage is outputted by the respective voltage output circuit (e.g., HV2) at, e.g., 0V (Vss). When the CAM page of the CAM block 300 is not selected, the second pass voltage is outputted by the respective voltage output circuit (e.g., HV2) at or lower than the power source voltage.

Each voltage output circuit generates different outputs of the pass and read voltages respective to the reading operations of the CAM block 300 and the associated memory cell block (not shown).

As described above, it is possible to use a low pass voltage in reading the CAM block 300 by storing chip information into the CAM cells, which are coupled to a selected word line, among a plurality of word lines coupled with the CAM block 300 while conditioning the remaining unselected CAM cells in an erased state. Thus, current consumption can be reduced while reading the CAM block, substantially preventing the electrical characteristics of the CAM cells from deterioration.

In some embodiments, all CAM cells included in the CAM block 300 are erased before storing the chip information in a CAM page coupled to a selected word line.

In some embodiments, chip information is stored only into CAM cells coupled to a selected one among the word lines coupled to the CAM block, while other CAM cells coupled to unselected word lines are conditioned in an erased state.

The foregoing is illustrative of exemplary embodiments and is not to be construed as limiting thereof. Although a few exemplary embodiments have been described, those skilled in the art will readily appreciate that many modifications are possible in exemplary embodiments without materially departing from the novel teachings and advantages. Accordingly, all such modifications are intended to be included within the scope of this invention as defined in the claims.

What is claimed is:

1. A method of operating a nonvolatile memory device, the method comprising:
    designating at least one memory cell block among a plurality of memory cell blocks of the nonvolatile memory device as a content addressable memory (CAM) block which includes a plurality of CAM cells coupled to respective word lines of the nonvolatile memory device;
    erasing all CAM cells included in the CAM block;
    selecting one word line among the word lines coupled to the CAM cells; and
    after said erasing and selecting, storing chip information for operations of the nonvolatile memory device into CAM cells coupled to the selected word line, while CAM cells coupled to remaining word lines other than the selected word line are maintained in an erased state.

2. The method according to claim 1, wherein the chip information includes redundancy information, and voltage information for use in programming, reading and erasing operations of the nonvolatile memory device.

3. The method according to claim 1, further comprising:
    reading the CAM cells coupled to the selected word line by applying a read voltage to the selected word line while applying a pass voltage at or lower than a power source voltage to the remaining word lines which are unselected.

4. The method according to claim 3, wherein the read voltage is 0V.

5. The method according to claim 1, further comprising:
    reading the CAM cells coupled to the selected word line when a power source voltage is supplied to a chip that supports operation of the nonvolatile memory device.

6. The method according to claim 3, wherein the pass voltage is lower than 5V.

* * * * *